(12) United States Patent
Wei et al.

(10) Patent No.: US 9,472,400 B2
(45) Date of Patent: Oct. 18, 2016

(54) METHOD FOR MAKING EPITAXIAL STRUCTURE

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/659,307

(22) Filed: Mar. 16, 2015

(65) Prior Publication Data

US 2015/0279657 A1    Oct. 1, 2015

(30) Foreign Application Priority Data

Mar. 27, 2014  (CN) .......................... 2014 1 0118380

(51) Int. Cl.
| | |
|---|---|
| *H01L 21/033* | (2006.01) |
| *H01L 21/02* | (2006.01) |
| *H01L 33/00* | (2010.01) |

(52) U.S. Cl.
CPC ....... *H01L 21/0254* (2013.01); *H01L 21/0242* (2013.01); *H01L 21/0262* (2013.01); *H01L 21/02458* (2013.01); *H01L 21/02494* (2013.01); *H01L 21/02639* (2013.01); *H01L 21/02647* (2013.01); *H01L 21/02658* (2013.01); *H01L 21/0332* (2013.01); *H01L 21/0337* (2013.01); *H01L 33/0075* (2013.01); *H01L 33/007* (2013.01)

(58) Field of Classification Search
CPC ................... H01L 21/0254; H01L 21/02647; H01L 21/0262; H01L 21/02639; H01L 21/02458; H01L 21/0242; H01L 21/02658; H01L 21/0332; H01L 33/0075; H01L 21/0337; H01L 21/02494; H01L 33/007; H01L 21/02603; H01L 21/0272; H01L 21/31144; B82Y 40/00
USPC ........................................................ 438/478
See application file for complete search history.

(56) References Cited

U.S. PATENT DOCUMENTS 8,603,347 B2 * 12/2013 Wang ................... B81C 1/00063
  216/40
2012/0175606 A1 * 7/2012 Wei ......................... B82Y 30/00
  257/43

* cited by examiner

*Primary Examiner* — Caleen Sullivan
(74) *Attorney, Agent, or Firm* — Zhigang Ma

(57) ABSTRACT

The disclosure relates to a method for making an epitaxial structure. A carbon nanotube film is placed on an epitaxial growth surface of a substrate. The carbon nanotube film defines a number of apertures so that part of the epitaxial growth surface is exposed from the apertures to form a first exposed part. A mask preform layer is deposited on the epitaxial growth surface to cover the carbon nanotube film. A thickness of the mask preform layer is smaller than a thickness of the carbon nanotube film so that a first part of the mask preform layer is deposited on surfaces of the carbon nanotube film and a second part of the mask preform layer is deposited on the first exposed part of the epitaxial growth surface. The carbon nanotube film is removed. An epitaxial layer is grown on the epitaxial growth surface.

17 Claims, 15 Drawing Sheets

METHOD FOR MAKING EPITAXIAL STRUCTURE

CROSS-REFERENCE TO RELATED APPLICATIONS

This application claims priority to Chinese Patent Application No. 201410118380.9 filed on Mar. 27, 2014 in the China Intellectual Property Office, the contents of which are incorporated by reference herein.

FIELD

The subject matter herein generally relates to epitaxial structures and methods for making the same.

BACKGROUND

Light emitting devices such as light emitting diodes (LEDs) based on group III-V nitride semiconductors such as gallium nitride (GaN) have been put into practice.

Since wide GaN substrate cannot be produced, the LEDs have been produced on a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which leads to cracking and difficulty in fabricating devices with small feature sizes. A solution for this is to form a plurality of grooves on the surface of the sapphire substrate by lithography or etching before growing the GaN layer. However, the process of lithography and etching is complex, high in cost, and will pollute the sapphire substrate.

What is needed, therefore, is to provide a method for solving the problem discussed above.

BRIEF DESCRIPTION OF THE DRAWINGS

Implementations of the present technology will now be described, by way of example only, with reference to the attached figures, wherein.

DETAILED DESCRIPTION

Figure 1:
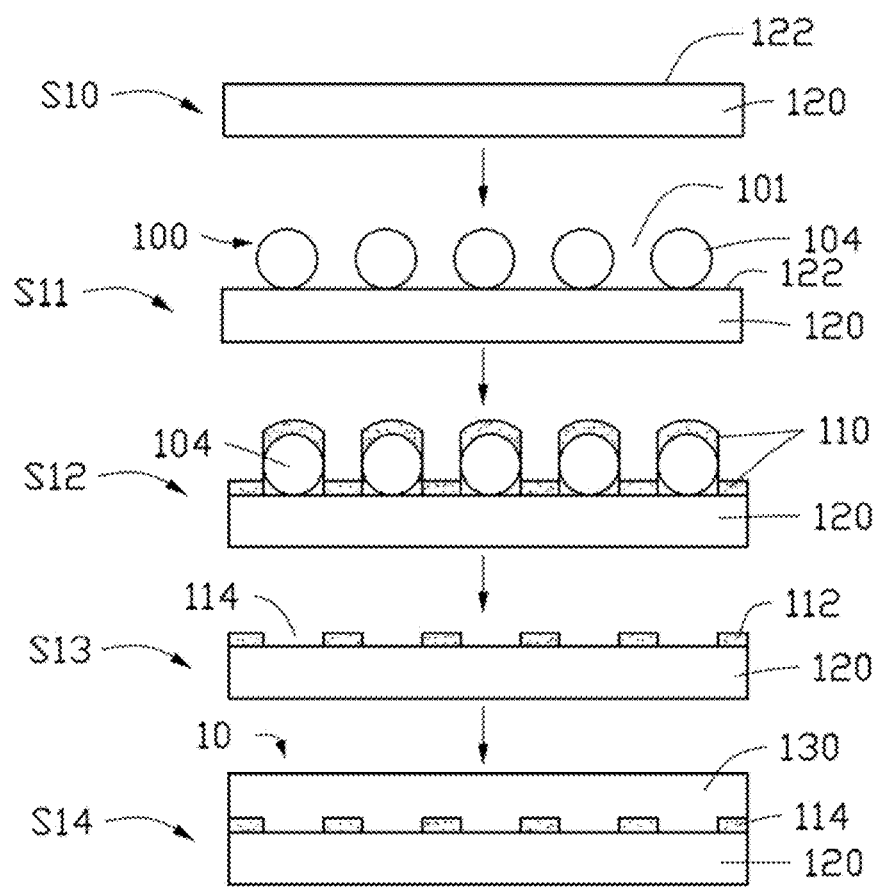
FIG. 1 is a flowchart of one embodiment of a method for making an epitaxial structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Referring to FIG. 1, a method for making an epitaxial structure 10 of one embodiment includes the following steps:

step (S10), providing a substrate 120 having an epitaxial growth surface 122;

step (S11), placing a carbon nanotube film 100 on the epitaxial growth surface 122 of the substrate 120, wherein the carbon nanotube film 100 defines a plurality of apertures 101, and part of the epitaxial growth surface 122 is exposed from the plurality of apertures 101 to form a first exposed part;

step (S12), depositing a mask preform layer 110 on the epitaxial growth surface 122 to cover the carbon nanotube film 100, wherein a thickness of the mask preform layer 110 is smaller than a thickness of the carbon nanotube film 100, a first part of the mask preform layer 110 is deposited on surfaces of the carbon nanotube film 100, and a second part of the mask preform layer 110 is deposited on the first exposed part of the epitaxial growth surface 122;

step (S13), obtaining a patterned mask 112 by removing the carbon nanotube film 100, wherein the patterned mask 112 defines a plurality of openings 114, and part of the epitaxial growth surface 122 is exposed from the plurality of openings 114 to form a second exposed part; and step (S14), epitaxially growing an epitaxial layer 130 on the epitaxial growth surface 122 of the substrate 120.

In step (S10), the epitaxial growth surface 122 can be used to grow the epitaxial layer 130. The epitaxial growth surface 122 is a clean and smooth surface. The substrate 120 can be a single-layer structure or a multi-layer structure. If the substrate 120 is a single-layer structure, the substrate 120 can be a single crystal structure having a crystal face used as the epitaxial growth surface 122. If the substrate 120 is a multi-layer structure, the substrate 120 should include at least one layer having the crystal face. The material of the substrate 120 can be GaAs, GaN, AlN, Si, SOI (silicon on insulator), SiC, MgO, ZnO, LiGaO$_2$, LiAlO$_2$, or Al$_2$O$_3$. The material of the substrate 120 can be selected according to the material of the epitaxial layer 130. The epitaxial layer 130 and the substrate 120 should have a small lattice mismatch and a thermal expansion mismatch. The size, thickness, and shape of the substrate 120 can be selected according to need. In one embodiment, the substrate 120 is a sapphire substrate.

In step (S11), the carbon nanotube film 100 includes a plurality of carbon nanotubes 104 substantially parallel with and spaced from each other so that the plurality of apertures 101 are defined. After the carbon nanotube film 100 is placed on the epitaxial growth surface 122, the plurality of carbon nanotubes 104 extend along a direction substantially parallel with the epitaxial growth surface 122. The plurality of carbon nanotubes 104 can extend along the crystallographic orientation of the substrate 120 or along a direction which forms an angle with the crystallographic orientation of the substrate 120. Part of the epitaxial growth surface 122 is sheltered by the carbon nanotube film 100, and part of the epitaxial growth surface 122 is exposed from the plurality of apertures 101.

Figure 2:
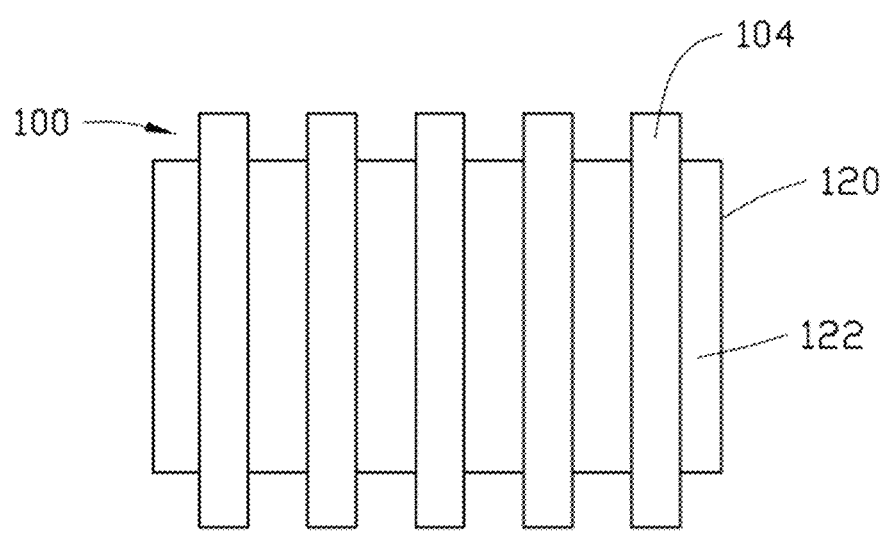
FIG. 2 is a top view of the Step (S11) of FIG. 1.

The carbon nanotube film 100 can be located on entire surface of the epitaxial growth surface 122 and extends beyond the edge of the epitaxial growth surface 122. Because the carbon nanotube film 100 extend beyond the edge of the epitaxial growth surface 122, it is easy to mechanical peel off the carbon nanotube film 100 from the substrate 120. As shown in FIG. 2, in one embodiment, each of the plurality of carbon nanotubes 104 has a length greater than a size of the substrate 120 along the length of the plurality of carbon nanotubes 104 and extends beyond the edge of the epitaxial growth surface 122.

Figure 3:
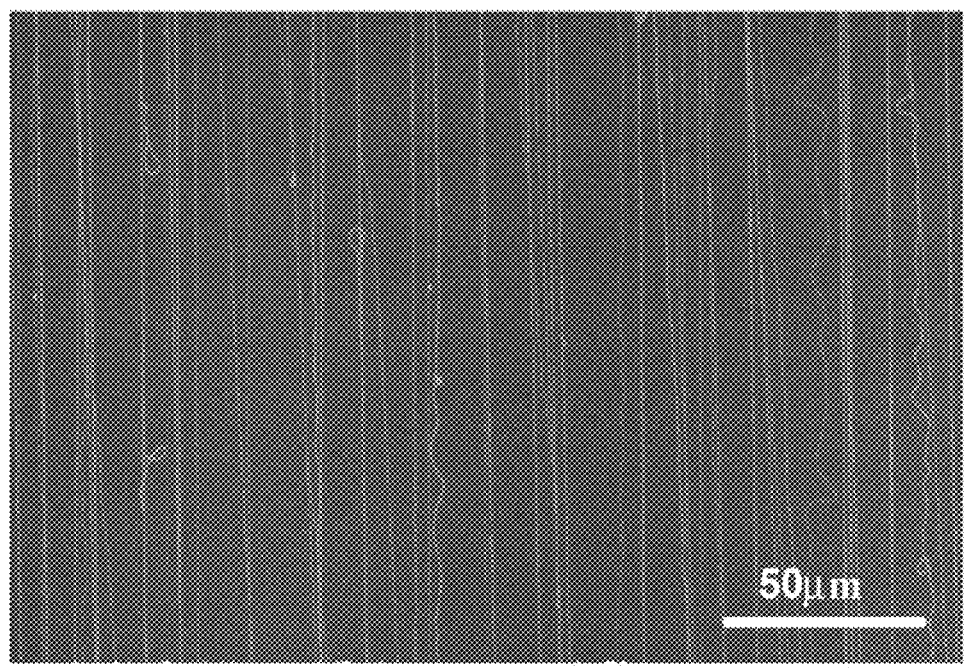
FIG. 3 is a Scanning Electron Microscope (SEM) image of a carbon nanotube array having a plurality of carbon nanotube parallel with a substrate.
Figure 4:
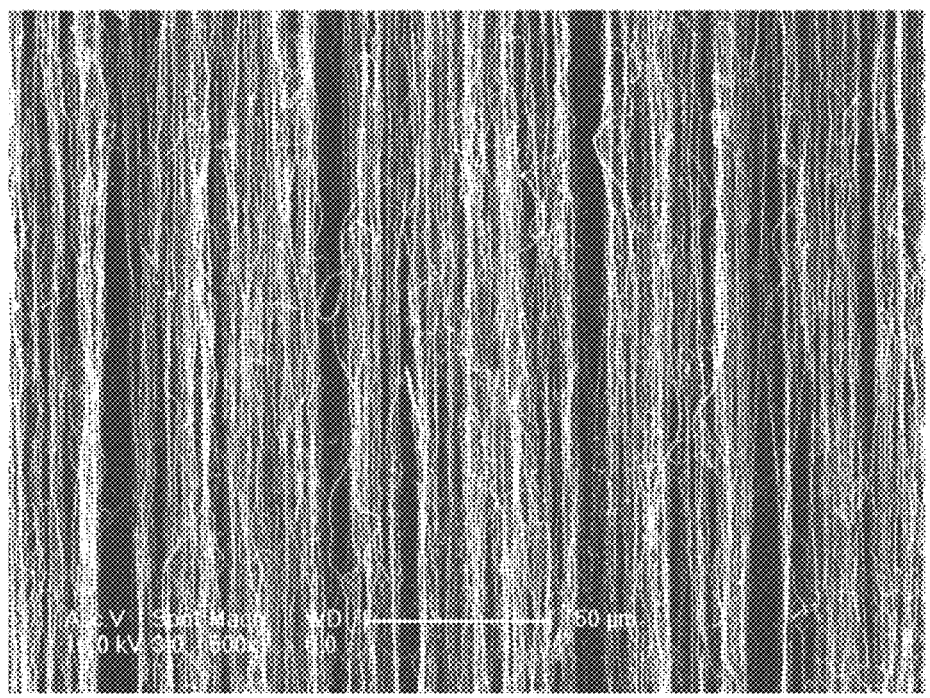
FIG. 4 is a SEM image of a carbon nanotube film.

Referring to FIG. 3, in one embodiment, the carbon nanotube film 100 includes a plurality of carbon nanotubes 104 aligned to form a carbon nanotube array. The plurality of carbon nanotubes 104 can have substantially the same length. Each of the plurality of carbon nanotubes 104 has a length greater than 1 centimeter. A distance between adjacent two of the plurality of carbon nanotubes 104 is in a range from about several micrometers to about 100 micrometers. In one embodiment, each of the plurality of carbon nanotubes 104 has a length greater than 3 centimeters, and the distance between adjacent two of the plurality of carbon nanotubes 104 is in a range from about 5 micrometers to about 20 micrometers. Each of the plurality of carbon nanotubes 104 has a diameter greater than 10 nanometers, such as greater than 20 nanometers and less than 100 nanometers. Also, the carbon nanotube film 100 can include two or more than two layers of crossed carbon nanotubes 104. The carbon nanotube film of FIG. 3 can be made by the method of U.S. Pat. No. 8,163,340 issued on Apr. 24, 2014.

Referring to FIGS. 4-7, in one embodiment, the carbon nanotube film 100 can be a drawn carbon nanotube film drawn from a carbon nanotube array substantially vertically to a substrate. The carbon nanotube film 100 is a substantially pure structure consisting of a plurality of carbon nanotubes 104, 106, with few impurities and chemical functional groups. The carbon nanotube film 100 is a free-standing structure. The term "free-standing structure" includes that the carbon nanotube film 100 can sustain the weight of itself when it is hoisted by a portion thereof without any significant damage to its structural integrity. Thus, the carbon nanotube film 100 can be suspended by two spaced supports. The majority of carbon nanotubes 104 of the carbon nanotube film 100 are joined end-to-end along a length direction of the carbon nanotubes 104 by van der Waals force therebetween so that the carbon nanotube film 100 is a free-standing structure. The carbon nanotubes 104, 106 of the carbon nanotube film 100 can be single-walled, double-walled, or multi-walled carbon nanotubes. The diameter of the single-walled carbon nanotubes can be in a range from about 0.5 nm to about 50 nm. The diameter of the double-walled carbon nanotubes can be in a range from about 1.0 nm to about 50 nm. The diameter of the multi-walled carbon nanotubes can be in a range from about 1.5 nm to about 50 nm.

The carbon nanotubes 104, 106 of the carbon nanotube film 100 are oriented along a preferred orientation. That is, the majority of carbon nanotubes 104 of the carbon nanotube film 100 are arranged to substantially extend along the same direction and in parallel with the surface of the carbon nanotube film 100. Each adjacent two of the majority of carbon nanotubes 104 are joined end-to-end by van der Waals force therebetween along the length direction. A minority of dispersed carbon nanotubes 106 of the carbon nanotube film 100 may be located and arranged randomly. However, the minority of dispersed carbon nanotubes 106 have little effect on the properties of the carbon nanotube film 100 and the arrangement of the majority of carbon nanotubes 104 of the carbon nanotube film 100. The majority of carbon nanotubes 104 are not absolutely form a direct line and extend along the axial direction, some of them may be curved and in contact with each other in microcosm. Some variations can occur in the carbon nanotube film 100.

Figure 5:
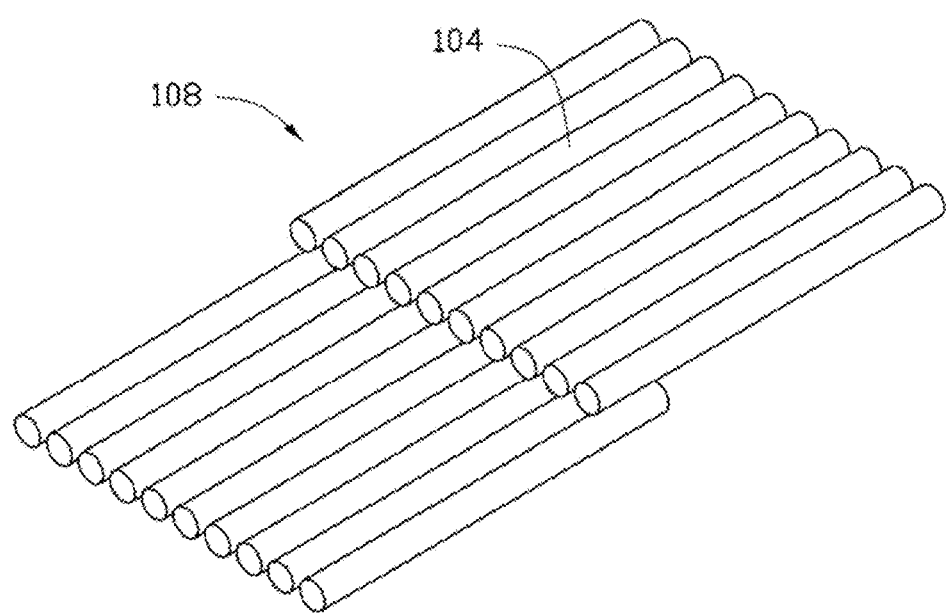
FIG. 5 is a schematic structural view of a carbon nanotube segment of the carbon nanotube film of FIG. 4.

Referring to FIG. 5, the carbon nanotube film 100 includes a plurality of successively oriented carbon nanotube segments 108, joined end-to-end by van der Waals force therebetween. Each carbon nanotube segment 108 includes a plurality of carbon nanotubes 104 parallel to each other, and combined by van der Waals force therebetween. A thickness, length and shape of the carbon nanotube segment 108 are not limited. A thickness of the carbon nanotube film 100 can range from about 0.5 nanometers to about 100 micrometers, such as 10 nanometers, 50 nanometers, 200 nanometers, 500 nanometers, 1 micrometer, 10 micrometers, or 50 micrometers.

Figure 6:
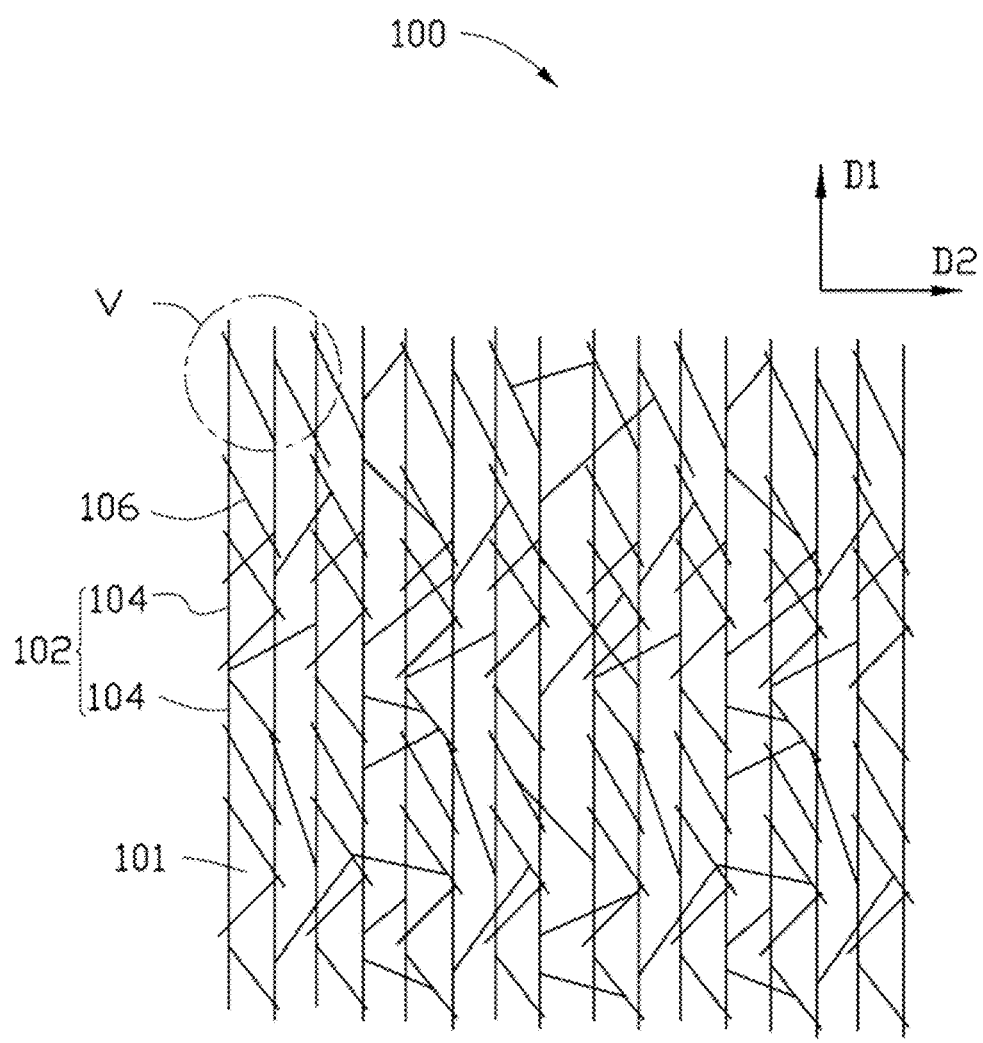
FIG. 6 is a schematic structural view of the carbon nanotube film of FIG. 4.
Figure 7:
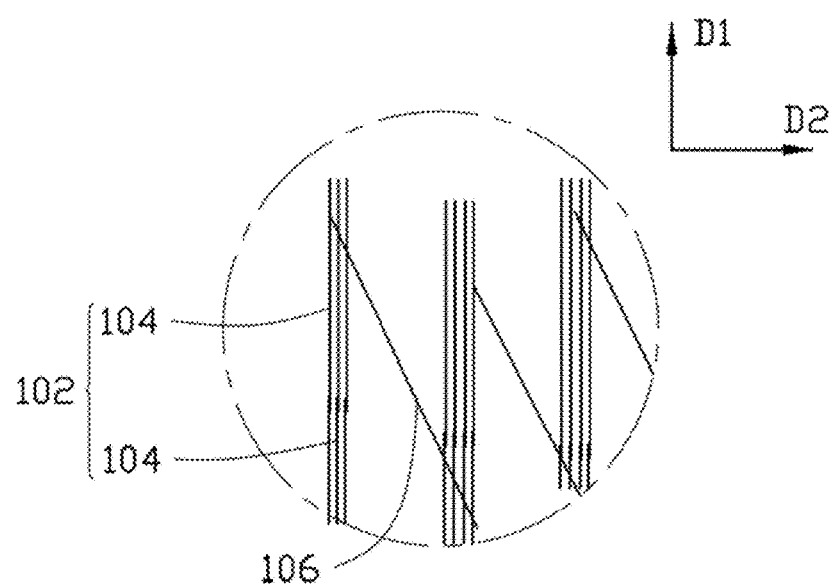
FIG. 7 is a partially enlarged view of FIG. 6.

Referring to FIGS. 6-7, the majority of carbon nanotubes 104 of the carbon nanotube film 100 are arranged to substantially extend along the same direction to form a plurality of carbon nanotube wires 102 substantially parallel with each other. The minority of carbon nanotubes 106 are randomly dispersed on and in direct contact with the plurality of carbon nanotube wires 102. The extending direction of the majority of carbon nanotubes 104 is defined as D1, and a direction perpendicular with D1 and parallel with the carbon nanotube film 100 is defined as D2. The carbon nanotubes 104 of each carbon nanotube wire 102 are joined end-to-end along D1, and substantially parallel and combined with each other along D1. The plurality of apertures 101 are defined between adjacent two of the plurality of carbon nanotube wires 102 or the plurality of carbon nanotubes 104.

The carbon nanotube film 100 is stretchable along D2. When the carbon nanotube film 100 is stretched along D2, the carbon nanotube film 100 can maintain its film structure. A distance between adjacent two of the plurality of carbon nanotube wires 102 will be changed according to the deformation of the carbon nanotube film 100 along D2. The distance between adjacent two of the plurality of carbon nanotube wires 102 can be in a range from about 0 micrometers to about 50 micrometers. The ratio of quantity or quality between the majority of carbon nanotubes 104 and the minority of dispersed carbon nanotubes 106 can be greater than or equal to 2:1 and less than or equal to about 6:1. The more the minority of dispersed carbon nanotubes 106, the greater the maximum deformation of the carbon nanotube film 100 along D2. The maximum deformation of the carbon nanotube film 100 along D2 can be about 300%. In one embodiment, the ratio of quantity between the majority of carbon nanotubes 104 and the minority of dispersed carbon nanotubes 106 is about 4:1.

The carbon nanotube film 100 can be made by following substeps:

step (S110), providing a carbon nanotube array on a substrate; and step (S112), drawing out the carbon nanotube film 100 from the carbon nanotube array by using a tool.

In step (S110), the carbon nanotube array includes a plurality of carbon nanotubes that are parallel to each other and substantially perpendicular to the substrate. The height of the plurality of carbon nanotubes can be in a range from about 50 micrometers to 900 micrometers. The carbon nanotube array can be formed by the substeps of: step (S1101) providing a substantially flat and smooth substrate; step (S1102) forming a catalyst layer on the substrate; step (S1103) annealing the substrate with the catalyst layer in air at a temperature approximately ranging from 700° C. to 900° C. for about 30 minutes to 90 minutes; step (S1104) heating the substrate with the catalyst layer to a temperature approximately ranging from 500° C. to 740° C. in a furnace with a protective gas therein; and step (S1105) supplying a carbon source gas to the furnace for about 5 minutes to 30 minutes and growing the carbon nanotube array on the substrate.

In step (S1101), the substrate can be a P-type silicon wafer, an N-type silicon wafer, or a silicon wafer with a film of silicon dioxide thereon. A 4-inch P-type silicon wafer is used as the substrate. In step (S1102), the catalyst can be made of iron (Fe), cobalt (Co), nickel (Ni), or any alloy thereof. In step (S1103), the protective gas can be made up of at least one of nitrogen ($N_2$), ammonia ($NH_3$), and a noble gas. In step (S1105), the carbon source gas can be a hydrocarbon gas, such as ethylene ($C_2H_4$), methane ($CH_4$), acetylene ($C_2H_2$), ethane ($C_2H_6$), or any combination thereof. The carbon nanotube array formed under the above conditions is essentially free of impurities, such as carbonaceous or residual catalyst particles.

In step (S112), the drawing out the carbon nanotube film 100 includes the substeps of: step (S1121) selecting one or more of carbon nanotubes in a predetermined width from the carbon nanotube array; and step (S1122) drawing the selected carbon nanotubes to form nanotube segments at an even and uniform speed to achieve the carbon nanotube film 100.

In step (S1121), the carbon nanotubes having a predetermined width can be selected by using an adhesive tape, such as the tool, to contact the super-aligned array. In step (S1122), the drawing direction is substantially perpendicular to the growing direction of the carbon nanotube array. Each carbon nanotube segment includes a plurality of carbon nanotubes parallel to each other.

In one embodiment, during the drawing process, as the initial carbon nanotube segments are drawn out, other carbon nanotube segments are also drawn out end-to-end due to van der Waals force between ends of adjacent segments. This process of drawing helps provide a continuous and uniform carbon nanotube film 100 having a predetermined width can be formed.

The width of the carbon nanotube film 100 depends on a size of the carbon nanotube array. The length of the carbon nanotube film 100 can be arbitrarily set as desired. In one useful embodiment, when the substrate is a 4-inch P-type silicon wafer, the width of the carbon nanotube film 100 can be in a range from about 0.01 centimeters to about 10 centimeters. The thickness of the carbon nanotube film 100 can be in a range from about 0.5 nanometers to about 10 micrometers.

Figure 8:
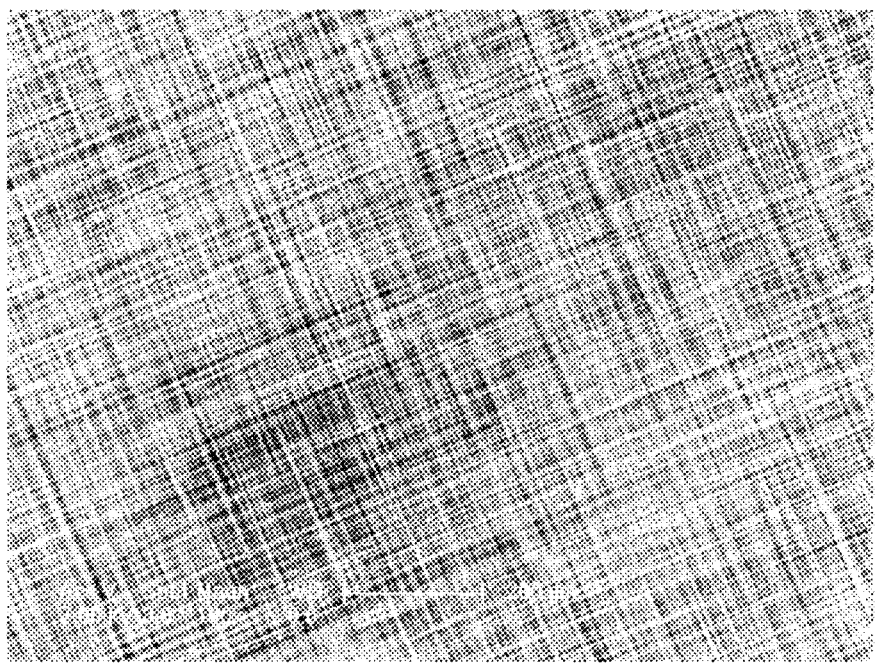
FIG. 8 is an SEM image of two cross-stacked carbon nanotube films.

Furthermore, at least two carbon nanotube films 100 can be stacked with each other or two or more carbon nanotube films 100 can be located coplanarly and combined by only the van der Waals force therebetween. As shown in FIG. 8, two carbon nanotube films 100 are stacked with each other, and the majority of carbon nanotubes 104 of the two carbon nanotube films 100 are substantially perpendicular with each other.

Figure 9:
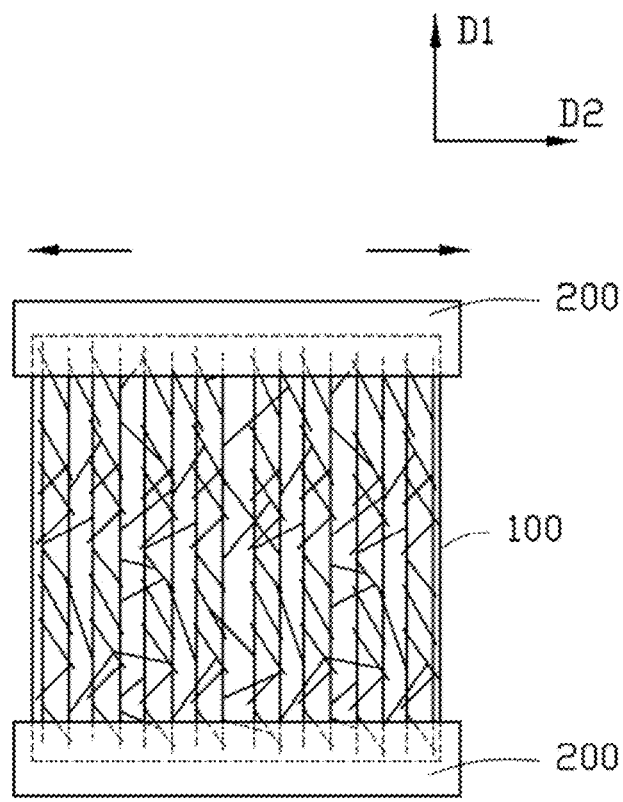
FIG. 9 is schematic view of one embodiment of a method for stretching the carbon nanotube film of FIG. 6.
Figure 10:
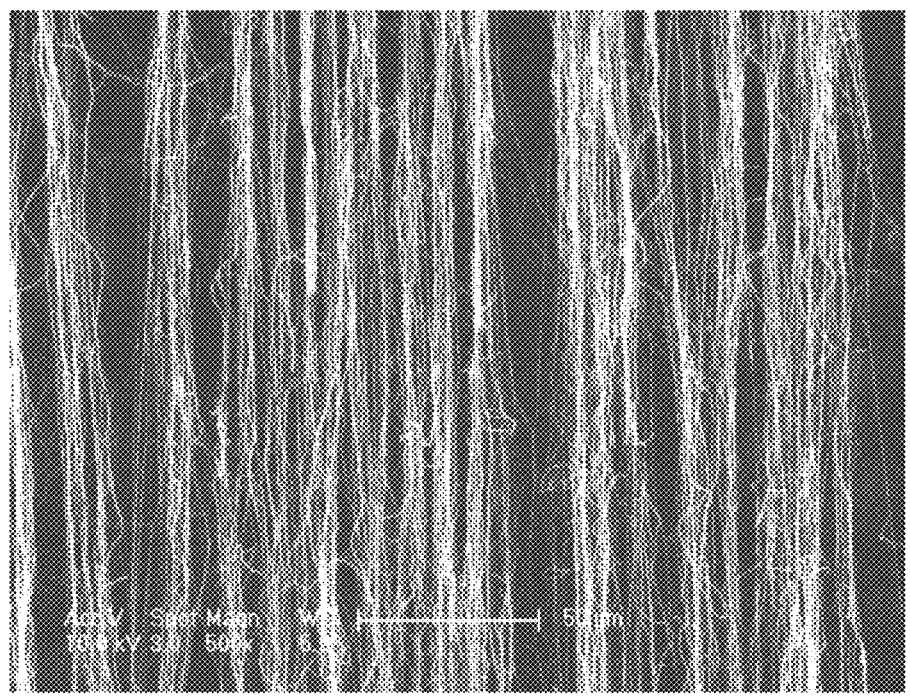
FIG. 10 is an SEM image of a stretched carbon nanotube film made by method of FIG. 7.

Furthermore, in one embodiment, step (S11) further includes stretching the carbon nanotube film 100 along D2 so that the apertures 101 have larger width. As shown in FIG. 9, the stretching the carbon nanotube film 100 includes: fixing two opposite sides of the carbon nanotube film 100 on two spaced elastic supporters 200 so that a portion of the carbon nanotube film 100 are suspended between the two elastic supporters 200, wherein two elastic supporters 200 are parallel with each other and extend along D2; stretching the two elastic supporters 200 along D2 to obtain a stretched carbon nanotube film. As shown in FIG. 10, the stretched carbon nanotube film has increased apertures. The two elastic supporters 200 can be elastic rubber, springs, or elastic bands. The speed of stretching the two elastic supporters 200 is less than 10 centimeters per second. The area of the carbon nanotube film 100 can be increased by stretching along D2.

Furthermore, in one embodiment, step (S11) can further include treating the carbon nanotube film 100 with organic solvent so that the apertures 101 have larger width. The organic solvent can be volatile, such as ethanol, methanol, acetone, dichloroethane, chloroform, or mixtures thereof. In one embodiment, the organic solvent is ethanol. The treating the carbon nanotube film 100 with organic solvent can be performed by applying the organic solvent to entire surface of the carbon nanotube film 100 suspended on a frame or immersing the entire carbon nanotube film 100 with the frame in an organic solvent.

In one embodiment, the treating the carbon nanotube film 100 with organic solvent includes soaking a suspended carbon nanotube film 100 with an atomized organic solvent at least one time. In one embodiment, the soaking a suspended carbon nanotube film 100 can include steps of:

providing a volatilizable organic solvent; atomizing the organic solvent into a plurality of dispersed organic droplets; and spraying the organic droplets onto the surface of the suspended carbon nanotube film 100 and the organic droplets gradually penetrating onto the carbon nanotubes of the carbon nanotube film 100, thereby making the suspended carbon nanotube film 100 be soaked at least one time by the organic droplets, and then make the carbon nanotube film shrink into a treated carbon nanotube film. The organic droplets are tiny organic solvent drops suspended in surrounding. The organic solvent can be atomized into the organic droplets by ultrasonic atomization method, high pressure atomizing method or other methods.

The organic solvent can be alcohol, methanol, acetone, acetic acid, and other volatilizable solvents. During the spraying process, a pressure is produced, when the organic droplets are sprayed, the pressure is small and can't break the carbon nanotube film 100. The diameter of each organic droplet is larger than or equal to 10 micrometers, or less than or equal to 100 micrometers, such as about 20 micrometers, 50 micrometers. Thus, an interface force is produced between the carbon nanotube film 100 and the organic droplets. The interface force can ensure that the carbon nanotube film 100 is shrunk and the carbon nanotubes in the carbon nanotube film 100 are dispersed more uniformly.

The organic solvent is volatile and easy to be volatilized. When the organic droplets are sprayed onto the carbon nanotube film 100 and then penetrated into the carbon nanotube film 100, the organic droplets are then volatilized, and the carbon nanotube segments 108 loosely arranged in the carbon nanotube film 100 are tightly shrunk. The diameter of each organic droplet is larger than or equal to 10 micrometers, or less than or equal to 100 micrometers, the soaked scope of the carbon nanotube segment of the carbon nanotube film 100 is limited by the small diameter of each organic droplet. Thus, diameters of the carbon nanotube segments 108 of the carbon nanotube film 100 can be shrunk into less than or equal to 10 micrometers, the carbon nanotube segments 108 are substantially invisible using naked eyes in the treated carbon nanotube film. The carbon nanotube film 100 is original black or grey. However, after the soaking with an atomized organic solvent, the carbon nanotube film 100 is shrunk into the treated carbon nanotube film which is more transparent.

In step (S12), the method for depositing the mask preform layer 110 can be physical vapor deposition (PVD), chemical vapor deposition (CVD), magnetron sputtering, or atomic layer deposition (ALD). The material of the mask preform layer 110 can be metal oxide, metal nitride, metal carbide, silicon oxide, silicon nitride, or silicon carbide. The thickness of the mask preform layer 110 can be in a range from about 10 nanometers to about 100 nanometers. In one embodiment, the thickness of the mask preform layer 110 is in a range from about 20 nanometers to about 50 nanometers. The first part of the mask preform layer 110 is deposited on surfaces of the plurality of carbon nanotubes 104, and the second part of the mask preform layer 110 is deposited on the first exposed part of the epitaxial growth surface 122. Because the thickness of the mask preform layer 110 is smaller than the thickness of the carbon nanotube film 100, the first part of the mask preform layer 110 and the second part of the mask preform layer 110 are spaced from each other and cannot form a continuous layer structure. Even if the first part of the mask preform layer 110 and the second part of the mask preform layer 110 are in contact with each other, the bonding force between the first part of the mask preform layer 110 and the second part of the mask preform layer 110 is very weak. Therefore, in following process, the first part of the mask preform layer 110 will be removed together with the carbon nanotube film 100. The second part of the mask preform layer 110 will be remained on the epitaxial growth surface 122 to form the patterned mask 112. Because the diameter of the carbon nanotubes 104 is very small, usually less than 100 nanometers, the width of the openings 114 is substantially same as the diameter of the carbon nanotubes 104.

In one embodiment, an alumina layer is deposited on the epitaxial growth surface 122 by atomic layer deposition, the source materials of the atomic layer deposition are trimethylaluminum and water, and the carrier gas is nitrogen gas. The alumina layer is deposited on the epitaxial growth surface 122 by following steps:

step (S121), placing the substrate 120 with the carbon nanotube film 100 thereon in a vacuum chamber of a atomic layer deposition device; and step (S122), alternately introducing trimethylaluminum and water vapor in to the chamber of the atomic layer deposition device.

In step (S122), the carrier gas is nitrogen gas. The flow rate of the carrier gas is about 5 sccm. The alternately introducing trimethylaluminum and water vapor includes following steps:

step (S1221), first evacuating the vacuum chamber to a pressure of about 0.23 Torr;

step (S1222), introducing trimethylaluminum in to the vacuum chamber until the pressure of the vacuum chamber rise to about 0.26 Torr;

step (S1223), second evacuating the vacuum chamber to the pressure of about 0.23 Torr;

step (S1224), introducing water vapor in to the vacuum chamber until the pressure of the vacuum chamber rise to about 0.26 Torr;

step (S1225), third evacuating the vacuum chamber to the pressure of about 0.23 Torr; and step (S1226), repeating step (S1222) to step (S1225) to start another cycle.

In each cycle, the second evacuating the vacuum chamber to the pressure of about 0.23 Torr takes about 25 seconds, and the third evacuating the vacuum chamber to the pressure of about 0.23 Torr takes about 50 seconds. The deposition velocity of the alumina layer is about 0.14 nm/cycle. The thickness of the alumina layer can be controlled by the cycle number.

In step (S13), the carbon nanotube film 100 can be removed by mechanical peeling, stripping by an adhesive tape or a roller having an adhesive outer surface, or oxidizing. In the process of mechanical peeling, the first part of the mask preform layer 110 is removed together with the carbon nanotube film 100, and the second part of the mask preform layer 110 remained on the epitaxial growth surface 122 to form the patterned mask 112. The bonding force between the carbon nanotube film 100 and the substrate 120 is weaker than the bonding force between the second part of the mask preform layer 110 and the substrate 120. The bonding force between the first part of the mask preform layer 110 and the second part of the mask preform layer 110 is very weak. Thus, in the process of stripping by an adhesive tape or a roller, the carbon nanotube film 100 and the first part of the mask preform layer 110 thereon can be removed together by selecting a proper adhesive tape or a roller. In the process of oxidizing, the substrate 120 with the carbon nanotube film 100 thereon can be placed in a furnace to anneal. After the carbon nanotube film 100 is oxidized, the first part of the mask preform layer 110 will fall on the epitaxial growth surface 122 and can be removed by ultracsonic cleaner. In one embodiment, during annealing the substrate 120 with the carbon nanotube film 100, the carbon nanotube film 100 is kept on the bottom of the substrate 120 so that the first part of the mask preform layer 110 will fall down because of the gravity. The annealing can be performed in a temperature in a range from about from 500° C. to 1000° C. and in air.

The pattern of the plurality of openings 114 is substantially the same as the pattern of the carbon nanotube film 100. In one embodiment, the plurality of openings 114 are a plurality of grooves substantially parallel with and spaced from each other. Each of the plurality of grooves extends from a first side of the epitaxial growth surface 122 to a second side opposite to the first side. The width of the plurality of openings 114 can be in a range from about 10 nanometers to about 100 nanometers. In one embodiment, the width of the plurality of openings 114 is in a range from about 20 nanometers to about 50 nanometers. Part of the epitaxial growth surface 122 is sheltered by the patterned mask 112, and part of the epitaxial growth surface 122 is exposed from the plurality of openings 114. Thus, the epitaxial layer 130 can grow from the exposed epitaxial growth surface 122. Compared to lithography or etching, the method of using the patterned mask 112 as mask is simple, low in cost, and will not pollute the substrate 120.

In step (S14), the epitaxial layer 130 is a single crystal layer grown on the epitaxial growth surface 122 by epitaxy growth method. The material of the epitaxial layer 130 can be the same as or different from the material of the substrate 120. If the epitaxial layer 130 and the substrate 120 are the same material, the epitaxial layer 130 is called a homogeneous epitaxial layer. If the epitaxial layer 130 and the substrate 120 have different material, the epitaxial layer 130 is called a heteroepitaxial epitaxial layer. The material of the epitaxial layer 130 can be semiconductor, metal or alloy. The semiconductor can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or $Co_2MnGa$. The thickness of the epitaxial layer 130 can be prepared according to need. The thickness of the epitaxial layer 130 can be in a range from about 100 nanometers to about 500 micrometers. For example, the thickness of the epitaxial layer 130 can be about 200 nanometers, 500 nanometers, 1 micrometer, 2 micrometers, 5 micrometers, 10 micrometers, or 50 micrometers.

Figure 11:
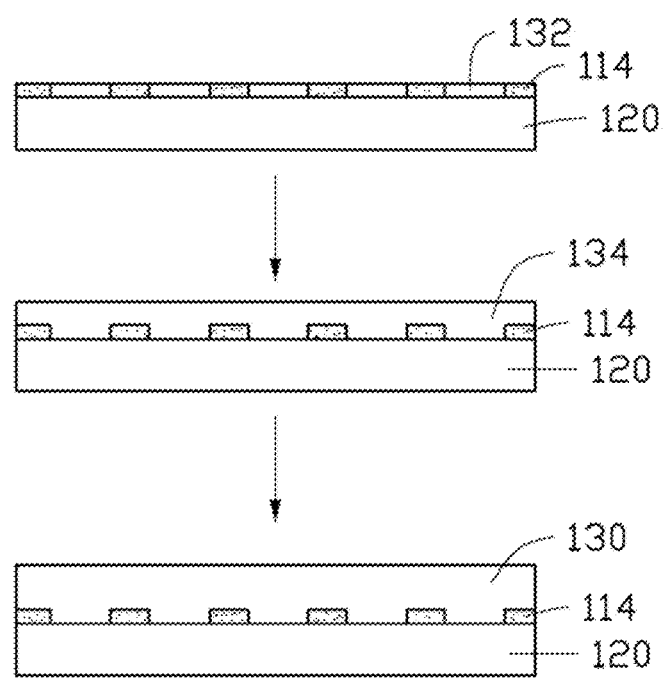
FIG. 11 is a schematic view of one embodiment of growing an epitaxial structure.

Referring to FIG. 11, step (S14) includes the following substeps:

step (S141), nucleating on the epitaxial growth surface 122 and growing a plurality of epitaxial crystal grains 132 along the direction substantially perpendicular to the epitaxial growth surface 122;

step (S142), forming a continuous epitaxial film 134 by making the epitaxial crystal grains 132 grow along the direction substantially parallel to the epitaxial growth surface 122; and step (S143), forming the epitaxial layer 130 by making the epitaxial film 134 grow along the direction substantially perpendicular to the epitaxial growth surface 122.

In step (S141), the epitaxial crystal grains 132 grow from the exposed part of the epitaxial growth surface 122 and through the opening 114. The process of the epitaxial crystal grains 132 growing along the direction substantially perpendicular to the epitaxial growth surface 122 is called vertical epitaxial growth.

In step (S142), the epitaxial crystal grains 132 are joined together to form an integral structure (the epitaxial film 134) to cover the patterned mask 112. The epitaxial crystal grains 132 grow and form a plurality of caves to enclose the patterned mask 112.

In step (S143), the epitaxial layer 130 is obtained by growing for a long duration of time. Because the patterned mask 112 can prevent the lattice dislocation between the epitaxial crystal grains 132 and the substrate 120 from growing, the epitaxial layer 130 has fewer defects therein.

The epitaxial layer 130 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

In one embodiment, the substrate 120 is a sapphire substrate, and the epitaxial layer 130 is grown on the sapphire substrate by MOCVD method. The nitrogen source gas is high-purity ammonia ($NH_3$), the Ga source gas is trimethyl gallium (TMGa) or triethyl gallium (TEGa), and the carrier gas is hydrogen ($H_2$). The patterned mask 112 is a patterned alumina layer. The growth of the epitaxial layer 130 includes the following steps:

step (a), locating the sapphire substrate 120 with the alumina patterned mask 112 thereon into a reaction chamber, heating the sapphire substrate to about 1100° C. to about 1200° C., introducing the carrier gas, and baking the sapphire substrate 120 for about 200 seconds to about 1000 seconds;

step (b), growing a low-temperature GaN buffer layer with a thickness of about 10 nanometers to about 50 nanometers by cooling down the temperature of the reaction chamber to a range from about 500° C. to 650° C. in the carrier gas atmosphere, and introducing the Ga source gas and the nitrogen source gas at the same time;

step (c), stopping the flow of the Ga source gas while maintaining the flow of the carrier gas and nitrogen source gas atmosphere, increasing the temperature to a range from about 1100° C. to about 1200° C., and annealing for about 30 seconds to about 300 seconds; and step (d), maintaining the temperature of the reaction chamber in a range from about 1000° C. to about 1100° C., and reintroducing the Ga source gas to grow the epitaxial layer 130 with less lattice mismatch with the substrate 120.

Figure 12:
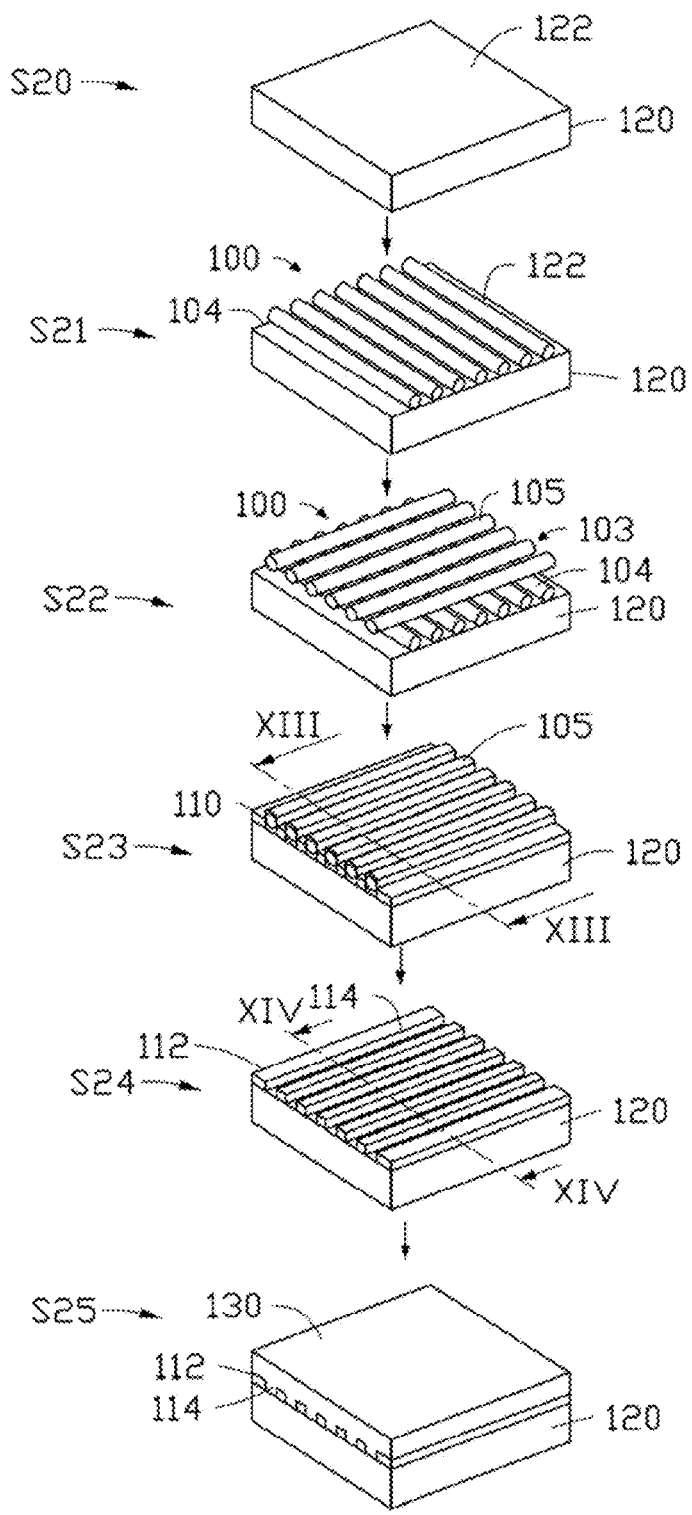
FIG. 12 is a flowchart of one embodiment of a method for making a epitaxial structure.

Referring to FIG. 12, a method for making an epitaxial structure 20 of one embodiment includes the following steps:

step (S20), providing a substrate 120 having an epitaxial growth surface 122;

step (S21), placing a first carbon nanotube film 100 on the epitaxial growth surface 122 of the substrate 120, wherein the first carbon nanotube film 100 includes a plurality of first carbon nanotubes 104 substantially parallel with and spaced from each other;

step (S22), placing a second carbon nanotube film 103 on the first carbon nanotube film 100, wherein the second carbon nanotube film 103 includes a plurality of second carbon nanotubes 105 substantially parallel with and spaced from each other, and a angle between extending directions of the plurality of first carbon nanotubes 104 and the plurality of second carbon nanotubes 105 is greater than 0 degrees;

step (S23), depositing a mask preform layer 110 on the epitaxial growth surface 122, wherein a thickness of the mask preform layer 110 is greater than a thickness of the first carbon nanotube film 100 and smaller than a total thickness of the first carbon nanotube film 100 and the second carbon nanotube film 103;

step (S24), obtaining a patterned mask 112 by removing the second carbon nanotube film 103, wherein the patterned mask 112 defines a plurality of openings 114, and part of the epitaxial growth surface 122 is exposed from the plurality of openings 114 to form a second exposed part; and step (S25), epitaxially growing an epitaxial layer 130 on the epitaxial growth surface 122 of the substrate 120.

The method for making an epitaxial structure 20 is similar to the method for making an epitaxial structure 10 described above except that both the first carbon nanotube film 100 and the second carbon nanotube film 103 are stacked on the epitaxial growth surface 122.

In step (S22), the angle between extending directions of the plurality of first carbon nanotubes 104 and the plurality of second carbon nanotubes 105 can be greater than 30 degrees. In one embodiment, the angle between extending directions of the plurality of first carbon nanotubes 104 and the plurality of second carbon nanotubes 105 is about 90 degrees.

Figure 13:
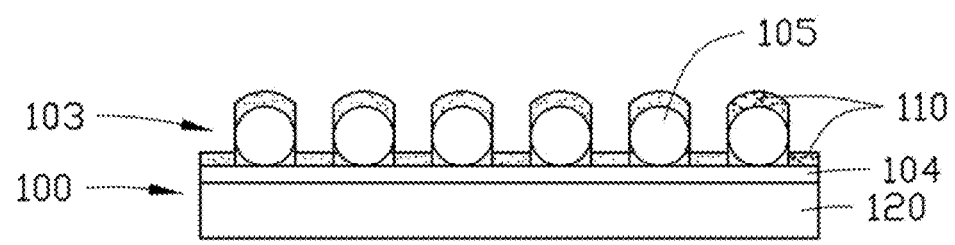
FIG. 13 is a schematic, cross-sectional view, along a line XIII-XIII of FIG. 12.

In step (S23), as shown in FIG. 13, because the thickness of the mask preform layer 110 is greater than the thickness of the first carbon nanotube film 100 and smaller than the total thickness of the first carbon nanotube film 100 and the second carbon nanotube film 103, a first part of the mask preform layer 110 is deposited on surfaces of the first carbon nanotube film 100 and the epitaxial growth surface 122 to cover the first carbon nanotube film 100, and a second part of the mask preform layer 110 is deposited on surfaces of the second carbon nanotube film 103.

Figure 14:
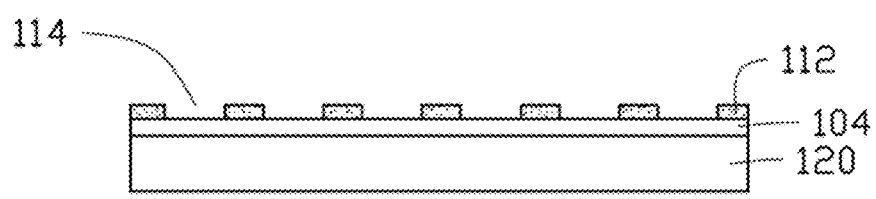
FIG. 14 is a schematic, cross-sectional view, along a line XIV-XIV of FIG. 12.

In step (S24), as shown in FIG. 14, the second part of the mask preform layer 110 is removed together with the second carbon nanotube film 103, and the first part of the mask preform layer 110 is remained on the epitaxial growth surface 122 to form the patterned mask 112. The plurality of openings 114 are a plurality of grooves substantially parallel with and spaced from each other. The plurality of openings 114 extends a long a direction substantially perpendicular with the plurality of first carbon nanotubes 104. Part of each of the plurality of first carbon nanotubes 104 is exposed from the plurality of openings 114.

The second carbon nanotube film 103 can be removed by mechanical peeling or stripping by an adhesive tape or a roller having an adhesive outer surface. Because the first carbon nanotube film 100 is covered by the mask preform layer 110, the first carbon nanotube film 100 would not be removed by process of peeling or stripping. In one embodiment, the first carbon nanotube film 100 and second carbon nanotube film 103 are removed together by oxidizing such as annealing in air. In one embodiment, the second carbon nanotube film 103 is removed by mechanical peeling first, and then the first carbon nanotube film 100 is removed by oxidizing such as annealing in air.

Figure 15:
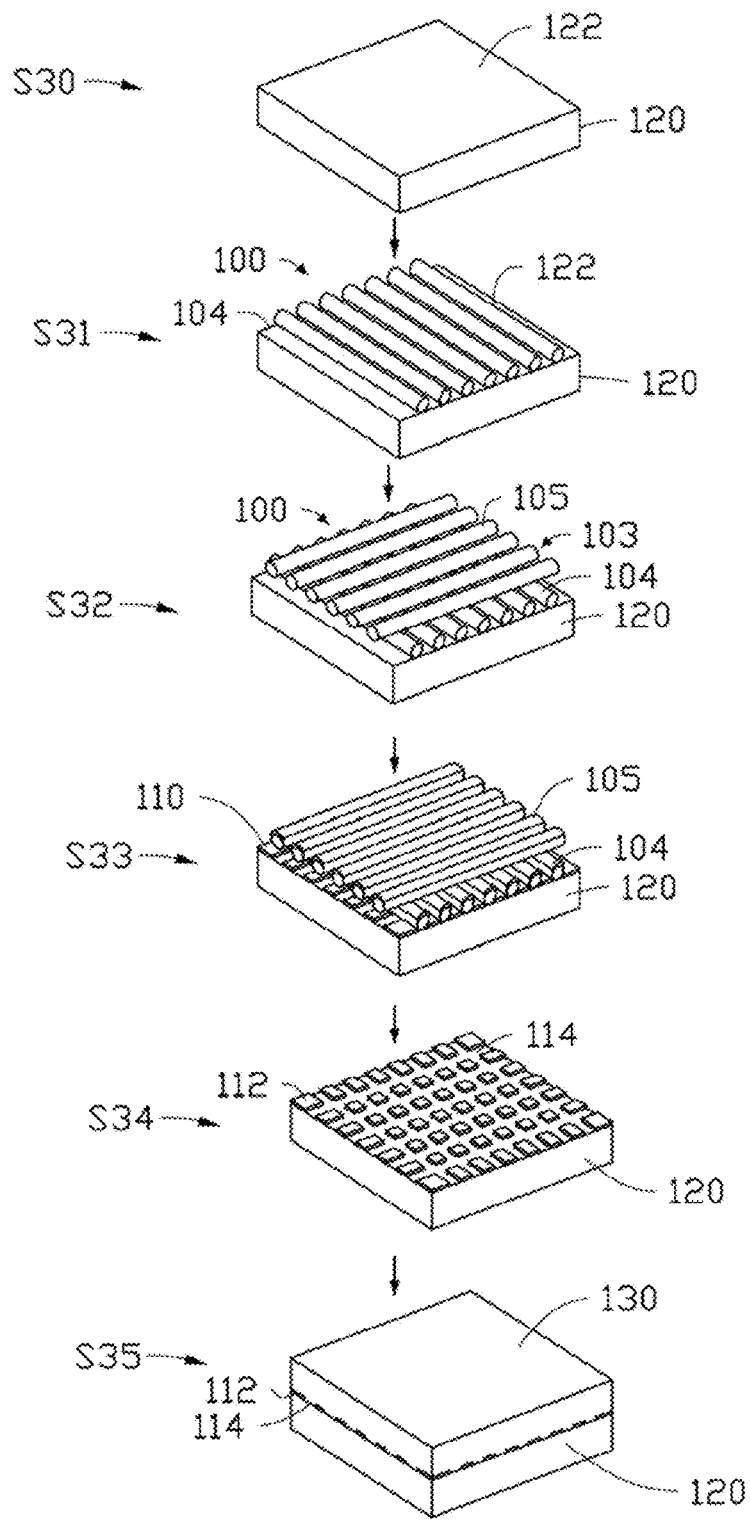
FIG. 15 is a flowchart of one embodiment of a method for making an epitaxial structure.

Referring to FIG. 15, a method for making an epitaxial structure 30 of one embodiment includes the following steps:

step (S30), providing a substrate 120 having an epitaxial growth surface 122;

step (S31), placing a first carbon nanotube film 100 on the epitaxial growth surface 122 of the substrate 120, wherein the first carbon nanotube film 100 includes a plurality of first carbon nanotubes 104 substantially parallel with and spaced from each other;

step (S32), placing a second carbon nanotube film 103 on the first carbon nanotube film 100, wherein the second carbon nanotube film 103 includes a plurality of second carbon nanotubes 105 substantially parallel with and spaced from each other, and a angle between extending directions of the plurality of first carbon nanotubes 104 and the plurality of second carbon nanotubes 105 is greater than 0 degrees;

step (S33), depositing a mask preform layer 110 on the epitaxial growth surface 122, wherein a thickness of the mask preform layer 110 is smaller than a thickness of the first carbon nanotube film 100;

step (S34), obtaining a patterned mask 112 by removing both the first carbon nanotube film 100 and the second carbon nanotube film 103, wherein the patterned mask 112 defines a plurality of openings 114, and part of the epitaxial growth surface 122 is exposed from the plurality of openings 114 to form a second exposed part; and step (S35), epitaxially growing an epitaxial layer 130 on the epitaxial growth surface 122 of the substrate 120.

The method for making an epitaxial structure 30 is similar to the method for making an epitaxial structure 20 described above except that the thickness of the mask preform layer 110 is smaller than the thickness of the first carbon nanotube film 100, and both the first carbon nanotube film 100 and the second carbon nanotube film 103 are removed.

In step (S33), a first part of the mask preform layer 110 is deposited on surfaces of the first carbon nanotube film 100 and the second carbon nanotube film 103, and a second part of the mask preform layer 110 is deposited on the epitaxial growth surface 122.

In step (S34), the first part of the mask preform layer 110 is removed together with the first carbon nanotube film 100 and the second carbon nanotube film 103, and the second part of the mask preform layer 110 is remained on the epitaxial growth surface 122 to form the patterned mask 112. The plurality of openings 114 are a plurality of bulges arranged to form a two-dimensional array.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for making an epitaxial structure, the method comprising:
providing a base comprising a substrate comprising an epitaxial growth surface and a carbon nanotube film located on the epitaxial growth surface, wherein the carbon nanotube film comprises a plurality of carbon nanotubes and defines a plurality of apertures, and part of the epitaxial growth surface is exposed from the plurality of apertures to form a first exposed part;
depositing a mask preform layer on the epitaxial growth surface to cover the carbon nanotube film, wherein a thickness of the mask preform layer is smaller than a thickness of the carbon nanotube film, a first part of the mask preform layer is deposited on surfaces of the carbon nanotube film, and a second part of the mask preform layer is deposited on the first exposed part of the epitaxial growth surface;

obtaining a patterned mask by removing the carbon nanotube film, wherein the patterned mask defines a plurality of openings, and part of the epitaxial growth surface is exposed from the plurality of openings to form a second exposed part; and epitaxially growing an epitaxial layer on the epitaxial growth surface, wherein the patterned mask remains on the epitaxial growth surface during the epitaxially growing the epitaxial layer.

2. The method of claim 1, wherein the plurality of carbon nanotubes are joined end-to-end along a length direction of the plurality of carbon nanotubes by van der Waals force therebetween, and the plurality of apertures extend along the length direction.

3. The method of claim 2, wherein the placing the carbon nanotube film comprises suspending the carbon nanotube film and stretching the carbon nanotube film along a direction perpendicular with the length direction of the plurality of carbon nanotubes.

4. The method of claim 2, wherein the placing the carbon nanotube film comprises suspending the carbon nanotube film and treating the carbon nanotube film with organic solvent.

5. The method of claim 1, wherein the carbon nanotube film extends beyond an edge of the epitaxial growth surface.

6. The method of claim 5, wherein each of the plurality of carbon nanotubes has a length greater than a size of the substrate, as measured along the length of the plurality of carbon nanotubes, and extends beyond the edge of the epitaxial growth surface.

7. The method of claim 1, wherein a material of the mask preform layer is selected from the group consisting of metal oxide, metal nitride, metal carbide, silicon oxide, silicon nitride, and silicon carbide.

8. The method of claim 1, wherein a thickness of the mask preform layer is in a range from about 10 nanometers to about 100 nanometers.

9. The method of claim 1, wherein the carbon nanotube film is removed by mechanical peeling, stripping by an adhesive tape, stripping by a roller having an adhesive outer surface, or oxidizing.

10. The method of claim 1, wherein the first part of the mask preform layer and the second part of the mask preform layer are spaced from each other and form a discontinuous layer structure.

11. The method of claim 1, wherein the first part of the mask preform layer is removed together with the carbon nanotube film, and the second part of the mask preform layer remains on the epitaxial growth surface to form the patterned mask.

12. The method of claim 1, wherein the plurality of openings are a plurality of grooves substantially parallel with and spaced from each other.

13. A method for making an epitaxial structure, the method comprising:

providing a base comprising a substrate comprising an epitaxial growth surface, a first carbon nanotube film located on the epitaxial growth surface, and a second carbon nanotube film located on the first carbon nanotube film; wherein the first carbon nanotube film comprises a plurality of first carbon nanotubes substantially parallel with and spaced from each other; and the second carbon nanotube film comprises a plurality of second carbon nanotubes substantially parallel with and spaced from each other, and a angle between extending directions of the plurality of first carbon nanotubes and the plurality of second carbon nanotubes is greater than 0 degrees;

depositing a mask preform layer on the epitaxial growth surface, wherein a thickness of the mask preform layer is greater than a thickness of the first carbon nanotube film and smaller than a total thickness of the first carbon nanotube film and the second carbon nanotube film;

obtaining a patterned mask by removing the second carbon nanotube film, wherein the patterned mask defines a plurality of openings, and part of the epitaxial growth surface is exposed from the plurality of openings to form a second exposed part; and epitaxially growing an epitaxial layer on the epitaxial growth surface, wherein the patterned mask remains on the epitaxial growth surface during the epitaxially growing the epitaxial layer.

14. The method of claim 13, wherein the angle between extending directions of the plurality of first carbon nanotubes and the plurality of second carbon nanotubes is greater than 30 degrees.

15. The method of claim 13, wherein a first part of the mask preform layer is deposited on surfaces of the first carbon nanotube film and the epitaxial growth surface to cover the first carbon nanotube film, and a second part of the mask preform layer is deposited on surfaces of the second carbon nanotube film.

16. The method of claim 15, wherein the second part of the mask preform layer is removed together with the second carbon nanotube film, and the first part of the mask preform layer is remained on the epitaxial growth surface to form the patterned mask.

17. The method of claim 13, wherein the obtaining the patterned mask further comprises removing the first carbon nanotube film.

* * * * *